(12) United States Patent
Azeroual et al.

(10) Patent No.: US 9,089,060 B1
(45) Date of Patent: Jul. 21, 2015

(54) BALL-OUT FOR DIFFERENTIAL SIGNALS

(75) Inventors: Dan Azeroual, Kiriat Ata (IL); Liav Ben Artsi, Nahariya (IL)

(73) Assignee: MARVELL ISRAEL (M.I.S.L.) LTD., Yokneam (IL)

( * ) Notice: Subject to any disclaimer, the term of this patent is extended or adjusted under 35 U.S.C. 154(b) by 237 days.

(21) Appl. No.: 13/275,588

(22) Filed: Oct. 18, 2011

Related U.S. Application Data

(60) Provisional application No. 61/394,730, filed on Oct. 19, 2010.

(51) Int. Cl.
*H05K 1/16* (2006.01)
*H05K 1/02* (2006.01)
*H05K 1/11* (2006.01)

(52) U.S. Cl.
CPC ............. *H05K 1/0298* (2013.01); *H05K 1/114* (2013.01)

(58) Field of Classification Search
CPC ............... H05K 1/0298; H05K 1/114; H05K 2201/09227; H05K 2201/10734; H05K 3/3436
USPC .......... 174/250, 255, 260; 361/790, 803, 767, 361/768, 783; 29/740, 739, 741; 438/108; 257/692, 698, 690
See application file for complete search history.

(56) References Cited

U.S. PATENT DOCUMENTS

| | | | | |
|---|---|---|---|---|
| 6,486,405 | B2* | 11/2002 | Lin ........................... | 174/113 R |
| 6,762,366 | B1* | 7/2004 | Miller et al. .................. | 174/250 |
| 2005/0099240 | A1* | 5/2005 | Lin et al. ............................ | 333/5 |
| 2006/0249302 | A1* | 11/2006 | Hall et al. ...................... | 174/260 |
| 2010/0058580 | A1* | 3/2010 | Yazdani ......................... | 29/740 |
| 2012/0001327 | A1* | 1/2012 | Zhou et al. ..................... | 257/738 |
| 2012/0068339 | A1* | 3/2012 | Miller et al. .................. | 257/738 |

OTHER PUBLICATIONS

U.S. Appl. No. 13/275,781, filed Oct. 18, 2011, entitled "Bump Out for Differential Signals."

* cited by examiner

*Primary Examiner* — Yuriy Semenenko

(57) ABSTRACT

Aspects of the disclosure provide a ball grid array (BGA) package. The ball grid array (BGA) package includes an integrated circuit (IC) packaged in the BGA package, first solder ball, a second solder ball and a third solder ball to transmit a first signal, a second signal, and a third signal. The first signal and the second signal are a pair of differential signals. The third solder ball has a substantially equal distance from the first solder ball and the second solder ball, and thus the first solder ball and the second solder ball are in symmetry with regard to the third solder ball.

19 Claims, 6 Drawing Sheets

US 9,089,060 B1

BALL-OUT FOR DIFFERENTIAL SIGNALS

INCORPORATION BY REFERENCE

This application claims the benefit of U.S. Provisional Application No. 61/394,730, "Differential Ball-Out Using Cross Assignment Arrangement" filed on Oct. 19, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A ball grid array (BGA) is a type of surface-mount packaging used for integrated circuits. A BGA package includes an array of solder balls on a surface of the BGA package. When the BGA package is assembled on a printed circuit board (PCB), electrical connections are formed using the array of solder balls to couple integrated circuits within the BGA with other circuits and interfaces on the PCB.

SUMMARY

Aspects of the disclosure provide a ball grid array (BGA) package. The ball grid array (BGA) package includes an integrated circuit (IC) packaged in the BGA package, a first ball module, a second ball module, and a third ball module. The IC is configured to process a first signal, a second signal, and a third signal. The first signal and the second signal are a first pair of differential signals. The first ball module of the BGA package is configured to conduct the first signal. The first ball module includes a first solder ball on a surface of the BGA package. The second ball module of the BGA package is configured to conduct the second signal. The second ball module includes a second solder ball on the surface of the BGA package. The third ball module of the BGA package is configured to conduct the third signal. The third ball module includes a third solder ball on the surface of the BGA package. The third solder ball has a first substantially equal distance from the first solder ball and the second solder ball, and thus the first solder ball and the second solder ball are in symmetry with regard to the third solder ball.

In an embodiment, the IC chip includes a serializer/deserializer (SERDES) that is electrically coupled to the first ball module and the second ball module to transmit the first pair of differential signals or receive the first pair of differential signals.

Further, in an example, the BGA package includes a fourth ball module of the BGA package configured to conduct a fourth signal. The fourth ball module includes a fourth solder ball on the surface of the BGA package. The fourth signal and the third signal are a second pair of differential signals. The fourth solder ball has a second substantially equal distance from the first solder ball and the second solder ball, and thus the first solder ball and the second solder ball are in symmetry with regard to the fourth solder ball In an embodiment, the first substantially equal distance is equal to the second substantially equal distance. Further, in an example, the first, second, third and fourth solder balls are located at corners of a convex quadrilateral shape, such as a diamond shape, a square shape, and the like.

According to an aspect of the disclosure, the BGA package also includes a plurality of ball modules coupled to the IC for return paths. In an example, the return paths are provided with a constant voltage, such as ground connection. The plurality of ball modules respectively includes a plurality of solder balls. The plurality of solder balls configured to collectively cause substantially equal electro-magnetic coupling field to the first solder ball and the second solder ball.

Aspects of the disclosure provide a method. The method includes forming a first ball module for conducting a first signal between an integrated circuit (IC) and a first solder ball on a surface of a ball grid array (BGA) package, forming a second ball module for conducting a second signal between the IC and a second solder ball on the surface of the BGA package, and forming a third ball module for conducting a third signal between the IC and a third solder ball on the surface of the BGA package. The first signal and the second signal are a pair of differential signals. The third solder ball has a first substantially equal distance to the first solder ball and the second solder ball, and thus the first solder ball and the second solder ball are in symmetry with regard to the third solder ball.

Aspects of the disclosure provide a printed circuit board (PCB). The PCB includes a first conductive unit, a second conductive unit and a third conductive unit. The first conductive unit is configured to make electrical connection with a first solder ball of a ball grid array (BGA) package to conduct a first signal. The first conductive unit includes a first land and a first via on the PCB. The second conductive unit is configured to make electrical connection with a second solder ball of the BGA package to conduct a second signal. The second conductive unit includes a second land and a second via on the PCB. The first signal and the second signal are a pair of differential signals. The third conductive unit is configured to make electrical connection with a third solder ball of the BGA package to conduct a third signal. The third conductive unit includes a third land and a third via on the PCB. The third via has a first substantially equal distance from the first via and the second via, and thus the first via and the second via are in symmetry with regard to the third via.

Aspects of the disclosure also provide a method in PCB fabrication. The method includes forming a first conductive unit on a PCB to conduct a first signal, forming a second conductive unit on the PCB to conduct a second signal and forming a third conductive unit on the PCB to conduct a third signal. The first conductive unit includes a first land that matches a first solder ball on a surface of a ball grid array (BGA) package, and a first via electrically connected to the first land. The second conductive unit includes a second land that matches a second solder ball on the surface of BGA package, and a second via electrically connected to the second land. The third conductive unit includes a third land that matches a third solder ball on the surface of the BGA package and a third via electrically connected to the third land. The first signal and the second signal are a pair of differential signals. The third via has a first substantially equal distance to the first via and the second via.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
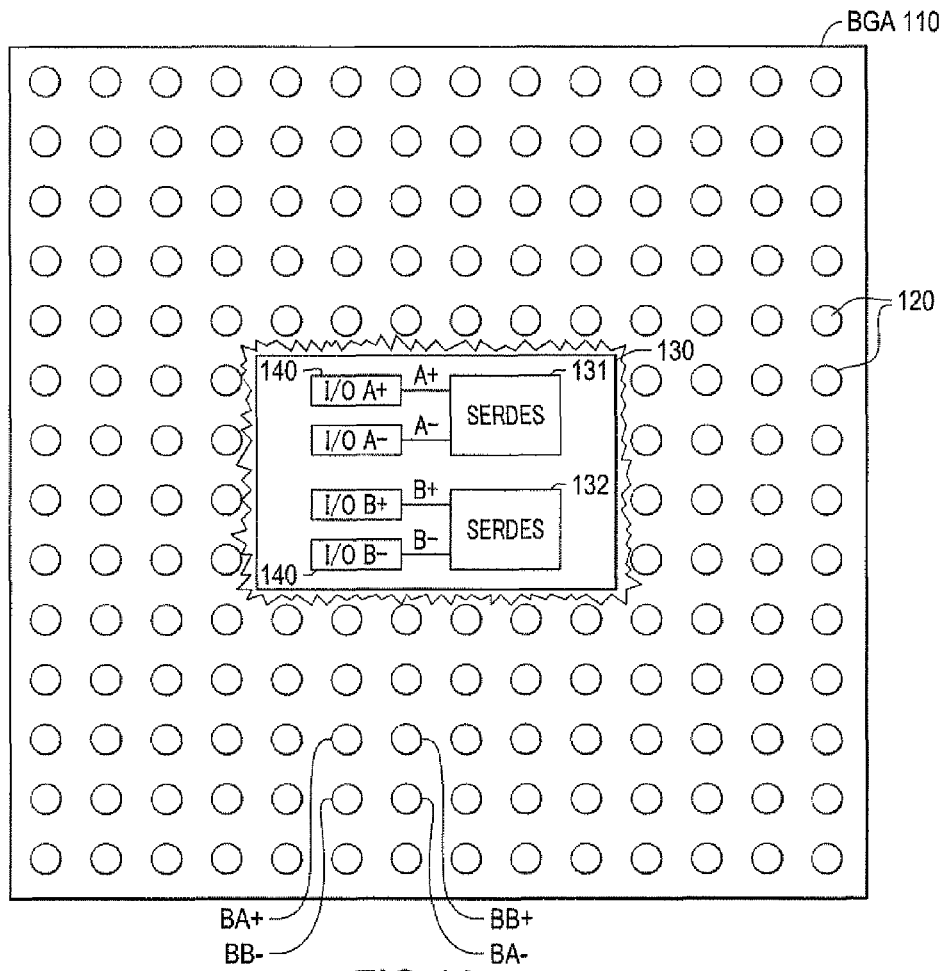
FIG. 1A shows a schematic diagram of a ball grid array (BGA) package example 110 according to an embodiment of the disclosure.

FIG. 1A shows a diagram of a ball grid array (BGA) package example 110 according to an embodiment of the disclosure. An integrated circuit (IC) chip 130 is packaged within the BGA package 110. On a surface of the BGA package 110, a plurality of solder balls 120 are arranged in an array.

The IC chip 130 includes various circuits for signal processing. In an example, the IC chip 130 includes signal generation circuits (not shown) to generate signals. The generated signals can be any suitable signals, such as analog signals, digital signals, and the like. The generated signals can be transmitted out of the IC chip 130. In another example, the IC chip 130 includes signal processing circuits (not shown). The IC chip 130 receives external signals, and the signal processing circuits process the received external signals. The external signals can be any suitable signals, such as analog signals, digital signals, and the like.

In an embodiment, the IC chip 130 includes one or more serializer/deserializer (SERDES) for generating or processing differential signals. In the FIG. 1A example, the IC chip 130 includes a first SERDES 131 and a second SERDES 132. The first SERDES 131 processes a first pair of differential signals A+ and A−. In an example, the first SERDES 131 generates A+ and A−, and drives A+ and A− out of the IC chip 130. In another example, the first SERDES 131 receives A+ and A− from circuits (not shown) that are external of the IC chip 130, and processes A+ and A−. The second SERDES 132 processes a second pair of differential signals B+ and B−. In an example, the second SERDES 132 generates B+ and B−, and drives B+ and B− out of the IC chip 130. In another example, the second SERDES 132 receives B+ and B− from circuits (not shown) that are external of the IC chip 130, and processes B+ and B−. In the FIG. 1A example, the IC chip 130 includes input/output (I/O) pads 140 for inputting or outputting the first pair of differential signals and the second pair of differential signals. It is noted that, in another embodiment, the IC chip 130 includes other suitable circuits (not shown) for generating or processing differential signals.

According to an embodiment of the disclosure, ball modules (not shown) are formed to electrically connect the I/O pads 140 to the plurality of solder balls 120 on the surface of the BGA package 110. The ball modules can be formed by various suitable techniques. In an embodiment, the IC chip 130 is a flip chip that includes solder bumps (not shown) on the I/O pads 140. The BGA package 110 includes a substrate that also has solder bumps (not shown) that are electrically connected to the solder balls 120. The solder bumps on the substrate match the solder bumps of the IC chip 130. The solder bumps on the IC chip 130 are aligned with the solder bumps on the substrate of the BGA package 110. Then, the solder bumps are reflowed to form the connection. In another embodiment, the I/O pads 140 of the IC chip 130 are wired bonded to form connections to the plurality of solder balls 120.

Generally, the solder balls 120 are attached to ball pads (not shown) on the surface of the BGA package 110. In a flip chip example, a ball module connecting an I/O pad 140 and a solder ball 120 includes a solder bump formed on the I/O pad 140, a solder bump formed on a substrate of the BGA package, a trace from the solder bump on the substrate to a ball pad on the surface of the BGA package, the ball pad, and the solder ball 120.

Figure 1B:
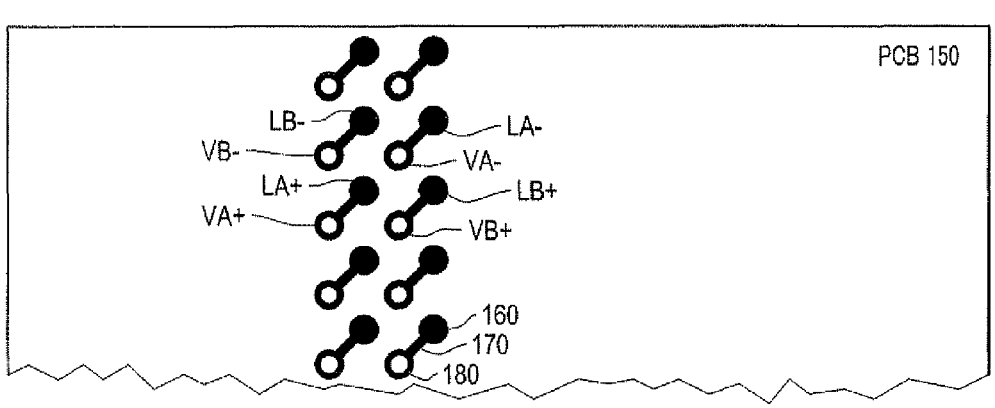
FIG. 1B shows a diagram of a printed circuit board (PCB) example 150 with lands matching the solder balls on the BGA package 110 according to an embodiment of the disclosure.

FIG. 1B shows a diagram of a printed circuit board (PCB) example 150 according to an embodiment of the disclosure. The BGA package 110 can be assembled onto the PCB 150. The PCB 150 includes a plurality of lands 160 on a surface. The plurality of lands 160 matches the plurality of solder balls 120. The plurality of solder balls 120 can be aligned onto the plurality of lands 160 to form electrical connections.

In addition, the PCB 150 includes a plurality of vias 180 that are electrically connected to the plurality of lands 160, for example, by metal wires 170. The plurality of vias 180 is electrically connected to traces on other layers of the PCB 150.

Figure 1C:
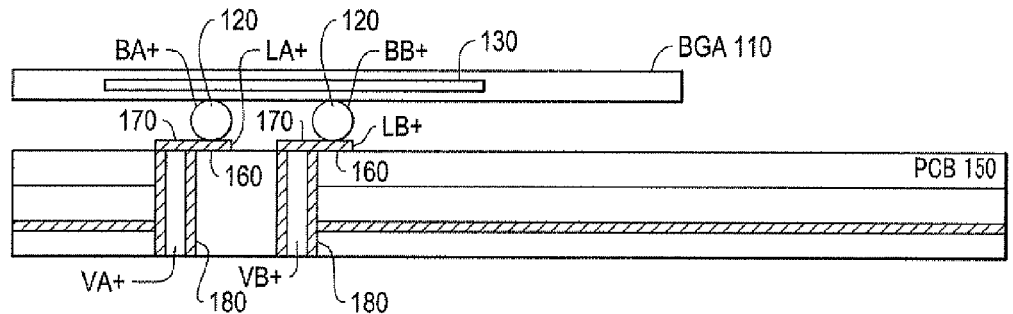
FIG. 1C shows a diagram of a cross-section view when the BGA package 110 is assembled on the PCB 150 according to an embodiment of the disclosure.

FIG. 1C shows a diagram of a cross-section view when the BGA package 110 is assembled on the PCB 150 according to an embodiment of the disclosure. In FIG. 1C, the solder balls 120 of the BGA package 110 are in contact with the lands 160 of the PCB 150. On the PCB 150, the wires 170 connect the lands 160 to the vias 180. The vias 180 are electrically connected to traces on other layers of the PCB 150.

Generally, the first pair of differential signals and the second pair of differential signals are transmitted between the IC chip 130 and the circuits external to the IC chip 130 via transmission lanes. Each transmission lane includes various conductive components electrically connected between the IC chip 130 and the circuits external to the IC chip 130. In an example, a transmission lane includes an I/O pad 140 on the IC chip 130, a ball module formed to connect the I/O pad 140 on the IC chip 130 with a solder ball 120 on the BGA package 110, a land 160 on the PCB 150, a metal wire 170 connecting the land 160 to a via 180, and the via 180. It is noted that the transmission lane can include other conductive components that further connect the via 180 to the circuits external of the IC chip 130.

Specifically, in the FIGS. 1A-1C, a transmission lane for A+ includes an I/O pad 140 for A+ (I/O A+), a ball module connecting I/O A+ with a solder ball 120 for A+ (BA+), a land 160 for A+ (LA+), a via 180 for A+ (VA+), and a metal wire between LA+ and VA+; a transmission lane for A− includes an I/O pad 140 for A− (I/O A−), a ball module connecting I/O A− with a solder ball 120 for A− (BA−), a land 160 for A− (LA−), a via 180 for A− (VA−), and a metal wire between LA− and VA−; a transmission lane for B+ includes an I/O pad 140 for B+ (I/O B+), a ball module connecting I/O B+ with a solder ball 120 for B+ (BB+), a land 160 for B+ (LB+), a via 180 for B+ (VB+), and a metal wire between LB+ and VB+; and a transmission lane for B− includes an I/O pad 140 for B− (I/O B−), a ball module connecting I/O B− with a solder ball 120 for B− (BB−), a land 160 for B− (LB−), a via 180 for B− (VB−), and a metal wire between LB− and VB−.

According to an embodiment of the disclosure, the ball modules are formed, such that the solder balls for differential signals have a cross-assignment geometry pattern. The cross-assignment geometry pattern of the solder balls for differential signals is referred to as a cross-assignment ball-out for differential signals. Specifically, a pair of solder balls on transmission paths for a pair of differential signals is on a diagonal line of a convex quadrilateral shape. According to an aspect of the disclosure, BA+ are BA− are in symmetry with regard to BB+ and BB−, and BB+ and BB− are in symmetry with regard to BA+ are BA−. In the FIG. 1A example, BA+, BA−, BB+ and BB− are four corners of a convex quadrilateral shape, such as a diamond shape, a square shape, and the like. BA+ and BA− are on a first diagonal line of the convex quadrilateral shape, and BB+ and BB− are on a second diagonal line of the convex quadrilateral shape.

According to an embodiment of the disclosure, the lands 160 on the PCB 150 are positioned to match the solder balls 120 of the BGA package 110. Further, on the PCB 150, the vias 180 are uniformly shifted from the corresponding lands 160 in the same shift direction and with the same shift distance. Thus, in an embodiment at a cross-section plane parallel to the surface of the PCB 150, the vias VA+, VA−, VB+ and VB− have the same geometry pattern as the lands LA+, LA−, LB+ and LB−, and have the same geometry pattern as the solder balls BA+, BA−, BB+ and BB−. Specifically, in the embodiment, VA+, VA−, VB+ and VB− are four corners of a square shape. VA+ and VA− are on a first diagonal line of the square shape, and VB+ and VB− are on a second diagonal line of the square shape.

According to an aspect of the disclosure, the cross-assignment ball-out for differential signals reduces cross talk noises, improves signal to noise ratio for transmission of differential signals, and thus improves speed limit for transmission lanes.

Figure 2:
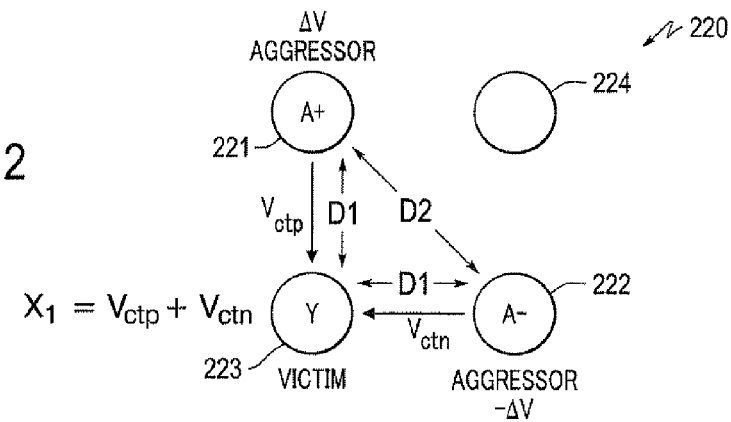
FIG. 2 shows a diagram of a cross assignment ball-out 220 for a pair of differential signals according to an embodiment of the disclosure.

FIG. 2 shows a diagram of a cross assignment ball-out 220 for a pair of differential signals according to an embodiment of the disclosure. The cross assignment ball-out 220 includes three solder balls 221, 222 and 223. The solder ball 223 has a same distance D1 to the solder balls 221 and 222. Thus, the solder balls 221 and 222 are in symmetry with regard to the solder ball 223. In an embodiment, the distance D1 is smaller than a distance D2 from the solder ball 221 to the solder ball 222. In other embodiment, the distance D1 is equal to or greater than the distance D2. The solder balls 221 and 222 are on transmission paths for a pair of differential signals A+ and A−, and the solder ball 223 is on a transmission path for a third signal Y. In an embodiment, the third signal Y is part of a second pair of differential signals.

In an embodiment, the solder balls 221, 222, 223 and a fourth solder ball 224 are corners of a convex quadrilateral shape, such as a diamond shape, a square shape, and the like. The solder balls 221 and 222 are on a diagonal line of the convex quadrilateral shape.

In the FIG. 2 example, the differential signals A+ and A− are aggressor signals, and the third signal Y is a victim signal. The aggressor signals generate cross talk noise to the victim signal. Due to the cross assignment ball-out, a sum of the cross talk noise ($X_1$) of the differential signals A+ and A− on the third signal Y is substantially equal to zero. Specifically, when A+ has a voltage change, the voltage change of A+ causes a cross talk noise $V_{ctp}$ on the third signal Y. When A− has a voltage change, the voltage change of A− causes a cross talk noise $V_{ctn}$ on the third signal Y. Because the solder ball 223 has the same distance to the solder balls 221 and 223, thus, when the voltage change of A+ and the voltage change of A− have the same absolute value and opposite signs, the cross talk noise $V_{ctp}$ and the cross talk noise $V_{ctn}$ have the same absolute value and opposite signs. Thus, a sum of the cross talk noise $V_{ctp}$ and the cross talk noise $V_{ctn}$ is substantially equal to zero.

However, when the differential signals A+ and A− have common mode noises, for example, when the voltage change of A+ and the voltage change of A− do not have the same absolute value, the sum of the cross talk noise $V_{ctp}$ and the cross talk noise $V_{ctn}$ is non zero.

It is noted that, in an embodiment, other conductive components on the transmission paths for the differential signals A+ and A− and the third signal Y, such as lands on a PCB, vias on a PCB, and the like, have the same symmetric geometry pattern as the solder balls 221, 222 and 223, thus cross talk noises of the differential signals A+ and A− to the third signal Y contributed by the other conductive components are also substantially equal to zero. In an embodiment, cross talk noise due to vias contributes to a relatively large portion of a total cross talk noise of transmission lanes. When vias have the same geometry pattern as the cross assignment ball-out 220, the total cross talk noise is significantly reduced. Specifically, when vias for the differential aggressor signals are in symmetry with regard to the via for the victim signal, the sum of the cross talk noises caused by the differential aggressor signals to the victim signal is substantially equal to zero.

Figure 3:
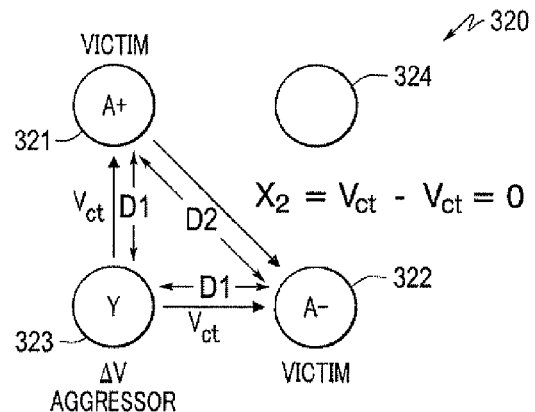
FIG. 3 shows a diagram of a cross assignment ball-out 320 for a pair of differential signals according to an embodiment of the disclosure.

FIG. 3 shows a diagram of a cross assignment ball-out 320 for a pair of differential signals according to an embodiment of the disclosure. The cross assignment ball-out 320 includes three solder balls 321, 322 and 323. The solder ball 323 has a same distance D1 to the solder balls 321 and 322. Thus, the solder balls 321 and 322 are in symmetry with regard to the solder ball 323. In an embodiment, the distance D1 is smaller than a distance D2 from the solder ball 321 to the solder ball 322; and in another embodiment, the distance D1 is larger than the distance D2. The solder balls 321 and 322 are on transmission paths for a pair of differential signals A+ and A−, and the solder ball 323 is on a transmission path for a third signal Y.

In an embodiment, the solder balls 321, 322, 323 and a fourth solder ball 324 are corners of a convex quadrilateral shape, such as a diamond shape, a square shape, and the like. The solder balls 321 and 322 are on a diagonal line of the convex quadrilateral shape.

In the FIG. 3 example, the differential signals A+ and A− are victim signals, and the third signal Y is an aggressor signal. The aggressor signal generates cross talk noise to the victim signals. Due to the cross assignment ball-out, a cross talk noise ($X_2$) generated by the aggressor signal Y to the differential signals A+ and A− is substantially equal to zero. Specifically, when the aggressor signal Y has a voltage change of $\Delta V$, the voltage change causes same amount of cross talk noise $V_{ct}$ on A+ and A−, due to the reason that the solder ball 323 has the same distance D1 to the solder balls 321 and 322. Thus, a difference of the cross talk noise generated by the aggressor signal Y on A+ to the cross talk noise generated by the aggressor signal Y on A− is substantially equal to zero.

It is noted that, in an embodiment, other conductive components on the transmission paths for the differential signals A+ and A− and the third signal Y, such as lands on a PCB, vias on a PCB, and the like, have the same symmetric geometry pattern as the solder balls 321, 322 and 323, thus the differential mode cross talk noise of Y on the differential signals A+ and A− contributed by the other conductive components is also substantially equal to zero. In an embodiment, cross talk noise due to vias contributes to a relatively large portion of a total cross talk noise of transmission lanes. When vias have the same geometry pattern as the cross assignment ball-out 320, the total cross talk noise is significantly reduced. Specifically, when vias for the differential victim signals are in symmetry with regard to the via for the aggressor signal, the difference of the cross talk noises caused by the aggressor signal to the differential victim signals is substantially equal to zero.

Figure 4:
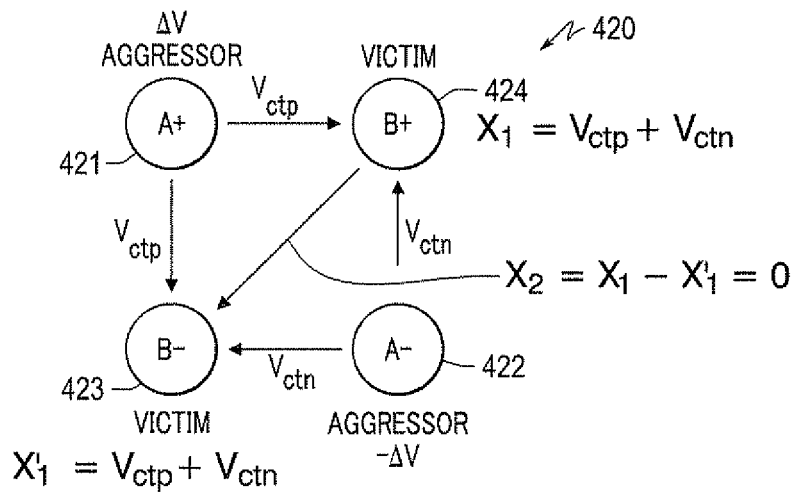
FIG. 4 shows a diagram of a cross assignment ball-out 420 for two pairs of differential signals according to an embodiment of the disclosure.

FIG. 4 shows a diagram of a cross assignment ball-out 420 for two pairs of differential signals according to an embodiment of the disclosure. The cross assignment ball-out 420 includes four solder balls 421, 422, 423 and 424. In the embodiment seen, the four solder balls are corners of a convex quadrilateral shape, such as a diamond shape, a square shape, and the like. The solder balls 421 and 422 are on a first diagonal line, and the solder balls 423 and 424 are on a second diagonal line. In an embodiment, the solder balls 421 and 422 are in symmetry with regard to each of the solder balls 423 and 424; and the solder balls 423 and 424 are in symmetry with regard to each of the solder balls 421 and 422. The solder balls 421 and 422 are on transmission paths for a first pair of differential signals A+ and A−, and the solder balls 423 and 424 are on transmission paths for a second pair of differential signals B+ and B−.

In the FIG. 4 example, the first pair of differential signals A+ and A− are aggressor signals, and the second pair of differential signals B+ and B− are victim signals. The aggressor signals generate cross talk noise to the victim signals. Due to the cross assignment ball-out, the cross talk noise generated by the differential aggressor signals A+ and A− to the differential victim signals B+ and B− are substantially equal to zero.

Specifically, according to an aspect of the disclosure, the common mode noise for the differential aggressor signals A+ and A− is substantially equal to zero. Thus, when A+ has a voltage change of $\Delta V$, A− has a voltage change of $-\Delta V$. $\Delta V$ of A+ causes the same amount of cross talk noise $V_{ctp}$ on both the victim signals B+ and B−, and $-\Delta V$ of A− causes the same amount of cross talk noise $V_{ctn}$ on both the victim signals B+ and B−. The cross talk noise $V_{ctp}$ and the cross talk noise $V_{ctn}$ have the same absolute value and opposite signs. Thus, a sum of the cross talk noise $V_{ctp}$ and the cross talk noise $V_{ctn}$ on B+ ($X_1$) is substantially equal to zero, and a sum of the cross talk noise $V_{ctp}$ and the cross talk noise $V_{ctn}$ on B+ ($X_1'$) is substantially equal to zero. The crosstalk noise ($X_2$) caused by the differential aggressor signals A+ and A− onto the differential victim signals B+ and B−, which is a difference of the cross talk noise on B+ to the cross talk noise on B−, is substantially equal to zero.

Further, according to an aspect of the disclosure, when the differential aggressor signals A+ and A− have common mode noises, for example, when the voltage change of A+ and the voltage change of A− do not have the same absolute value, the sum of the cross talk noise $V_{ctp}$ and the cross talk noise $V_{ctn}$ on B+ ($X_1$) is not equal to zero, and the sum of the cross talk noise $V_{ctp}$ and the cross talk noise $V_{ctn}$ on B− ($X_1'$) is not equal to zero. However, $X_1$ is equal to $X_1'$, and thus the crosstalk noise ($X_2$) caused by the differential aggressor signals A+ and A− onto the differential victim signals B+ and B− is substantially equal to zero.

It is noted that, in an embodiment, other conductive components on the transmission paths for the first pair of differential signals A+ and A− and the second pair of differential signals B+ and B−, such as lands on a PCB, vias on a PCB, and the like, have the same symmetric geometry pattern as the solder balls 421, 422, 423 and 424, thus the cross talk noises of differential aggressor signals A+ and A− onto the differential victim signals B+ and B− contributed by the other conductive components is substantially equal to zero. In an embodiment, cross talk noise due to vias contributes to a relatively large portion of a total cross talk noise of transmission lanes. When vias have the same symmetric geometry pattern, for example, the vias for the differential aggressor signals are in symmetry to the vias for the differential victim signals, and the vias for the differential victim signals are in symmetry to the vias for the differential aggressor signals, as the cross assignment ball-out 420, the total cross talk noise is significantly reduced.

Figure 5:
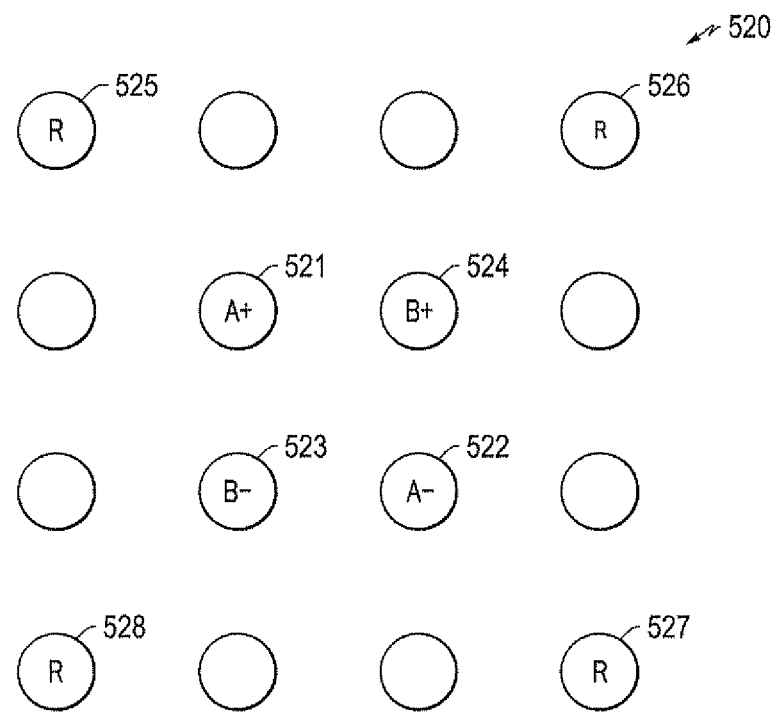
FIG. 5 shows a diagram of a cross assignment ball-out 520 according to an embodiment of the disclosure.

FIG. 5 shows a diagram of a cross assignment ball-out 520 according to an embodiment of the disclosure. The cross assignment ball-out 520 is similar to the cross assignment ball-out 420 for two pairs of differential signals. In addition, in an embodiment, the cross assignment ball-out 520 includes solder balls 525-527 on return paths that can be grounded. In another embodiment, the solder balls 525-527 are provided with a constant voltage.

It is noted that the solder balls 525-527 are positioned in symmetry with regard the solder balls 521 and 522 of a first pair of differential signals, and the solder balls 525-527 are positioned in symmetry with regard the solder balls 523 and 524 of a second pair of differential signals. The solder balls 525-527 collectively maintain a symmetrical electromagnetic field influence of the differential aggressor signals on to the differential victim signals of the two pairs.

Similarly, when other conductive components on the return paths for grounding, such as lands on a PCB, vias on a PCB, and the like, have the same geometry pattern as the solder balls 525-527, symmetrical electromagnetic field is maintained and the crosstalk noise can be reduced.

Figure 6:
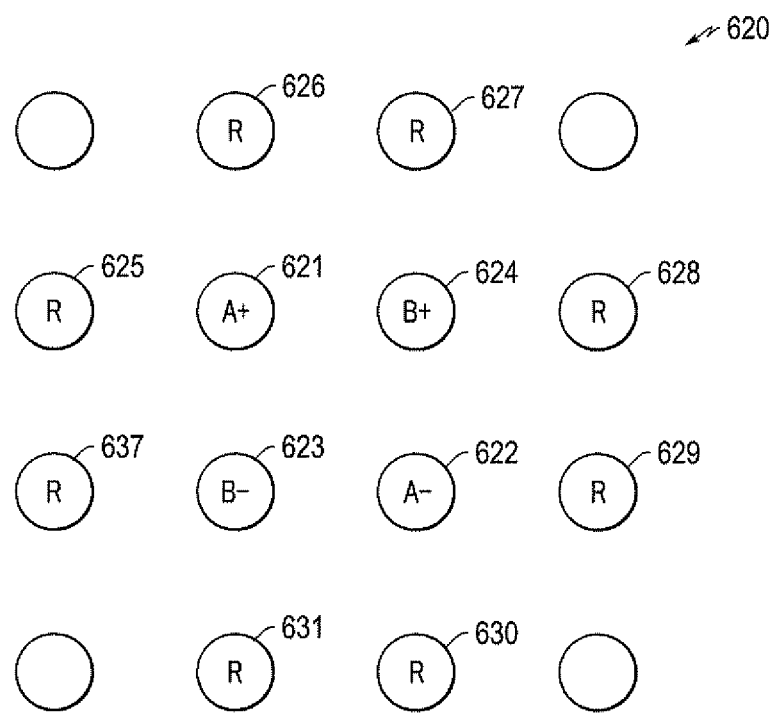
FIG. 6 shows a diagram of a cross assignment ball-out 620 according to an embodiment of the disclosure.

FIG. 6 shows a diagram of a cross assignment ball-out 620 according to an embodiment of the disclosure. The cross assignment ball-out 620 is similar to the cross assignment ball-out 420 for two pairs of differential signals. In addition, the cross assignment ball-out 620 includes solder balls 625-632 on return paths that are grounded.

It is noted that the solder balls 625-632 are positioned in symmetry with regard the solder balls 621 and 622 of a first pair of differential signals, and the solder balls 625-632 are positioned in symmetry with regard the solder balls 623 and 624 of a second pair of differential signals. The solder balls 625-632 collectively maintain a symmetrical electromagnetic field influence of the differential aggressor signals on to the differential victim signals of the two pairs.

Similarly, when other conductive components on the return paths for grounding, such as lands on a PCB, vias on a PCB, and the like, have the same geometry pattern as the solder balls 625-632, symmetrical electromagnetic field is maintained and the crosstalk noise can be reduced.

Figure 7:
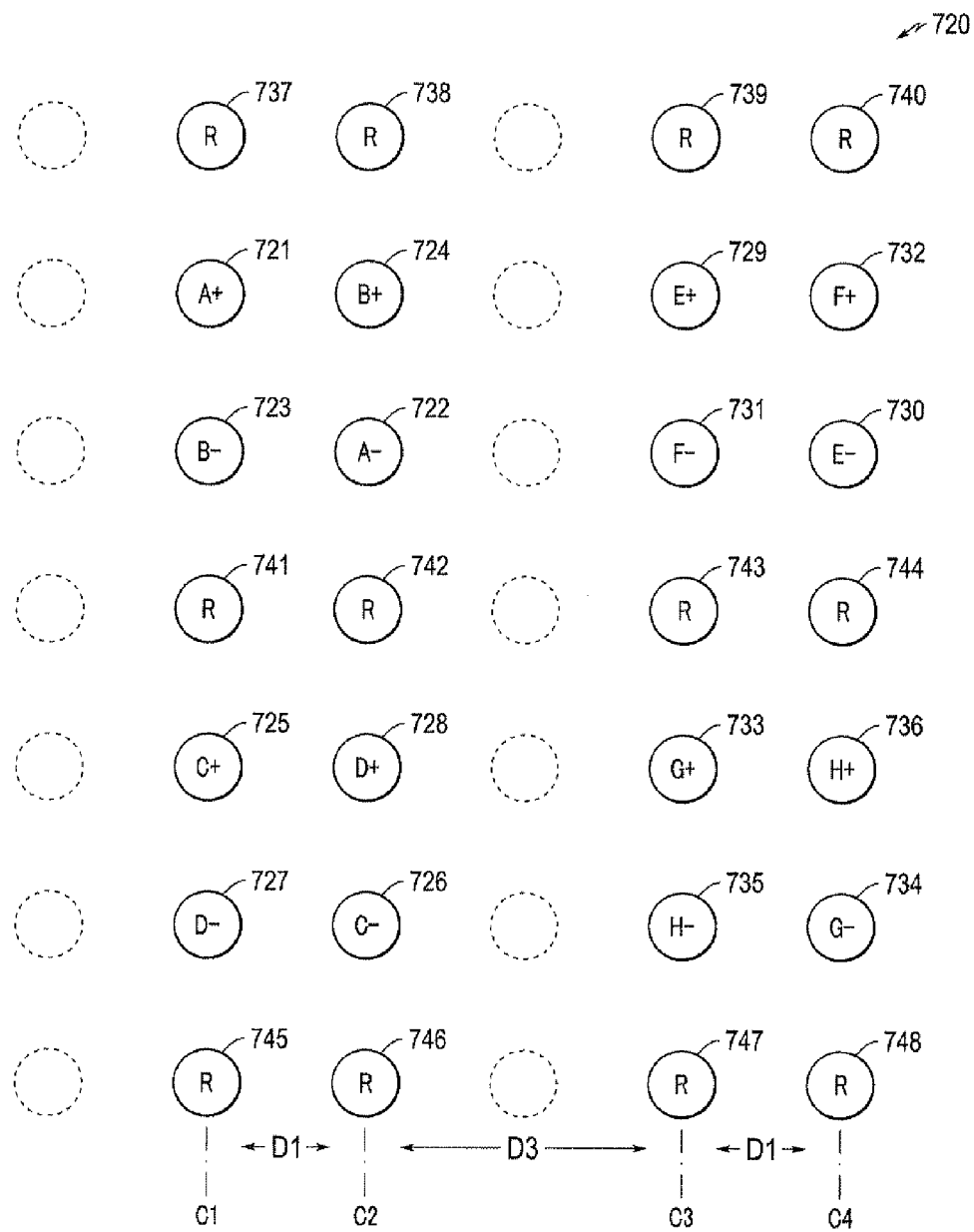
FIG. 7 shows a diagram of a cross assignment ball-out 720 according to an embodiment of the disclosure.

FIG. 7 shows a diagram of a cross assignment ball-out 720 according to an embodiment of the disclosure. The cross assignment ball-out 720 includes an array of solder balls. The array includes four columns C1-C4. The distance from C1 to C2 is D1, the distance from C3 to C4 is also D1. The distance from C2 to C3 is D3. In the embodiment seen in FIG. 7, D3 is much larger than D1. In an example, D3 is twice of D1. In another embodiment, D3 is equal or smaller than D1.

It is noted that cross talk noise is inverse proportional to distance. When the distance between two conductive components is larger than a threshold, the cross talk noise between the two conductive components can be ignored. In the FIG. 7 example, when D3 is larger than a threshold, the cross talk noise between C2 and C3 can be ignored.

The cross assignment ball-out 720 includes solder balls for eight pair of differential signals. Specifically, in the embodiment seen, four solder balls 721-724 are corners of a square shape. The solder balls 721 and 722 are on a first diagonal line of the square shape, and the solder balls 723 and 724 are on a second diagonal line of the square shape. The solder balls 721 and 722 are on transmission paths for a first pair of differential signals A+ and A−, and the solder balls 723 and 724 are on transmission paths for a second pair of differential signals B+ and B−.

In the embodiment seen, four solder balls 725-728 are corners of a square shape. The solder balls 725 and 726 are on a first diagonal line of the square shape, and the solder balls 727 and 728 are on a second diagonal line of the square shape. The solder balls 725 and 726 are on transmission paths for a third pair of differential signals C+ and C−, and the solder balls 727 and 728 are on transmission paths for a fourth pair of differential signals D+ and D−.

In the embodiment seen, four solder balls 729-732 are corners of a square shape. The solder balls 729 and 730 are on a first diagonal line of the square shape, and the solder balls 731 and 732 are on a second diagonal line of the square shape. The solder balls 729 and 730 are on transmission paths for a fifth pair of differential signals E+ and E−, and the solder balls 731 and 732 are on transmission paths for a sixth pair of differential signals F+ and F−.

In the embodiment seen, four solder balls 733-736 are corners of a square shape. The solder balls 733 and 734 are on a first diagonal line of the square shape, and the solder balls 735 and 736 are on a second diagonal line of the square shape. The solder balls 733 and 734 are on transmission paths for a seventh pair of differential signals H+ and H−, and the solder balls 735 and 736 are on transmission paths for an eighth pair of differential signals G+ and G−.

It is noted that the cross assignment ball-out 720 uses similar cross assignment as the cross assignment ball-out 420 for two pairs of differential signals. The two pairs of differential signals may have different driving strength, thus, one pair is victim pair and the other is aggressor pair. The common mode and differential mode cross talk noises on the victim pair due to the aggressor pair is substantially equal to zero.

In addition, the cross assignment ball-out 720 includes solder balls 737-748 on return paths that are grounded. Because the solder balls 737-748 are positioned to collectively cause substantially equal electro-magnetic coupling field to the differential signals, the cross talk noise to the differential signals are reduced.

Figure 8:
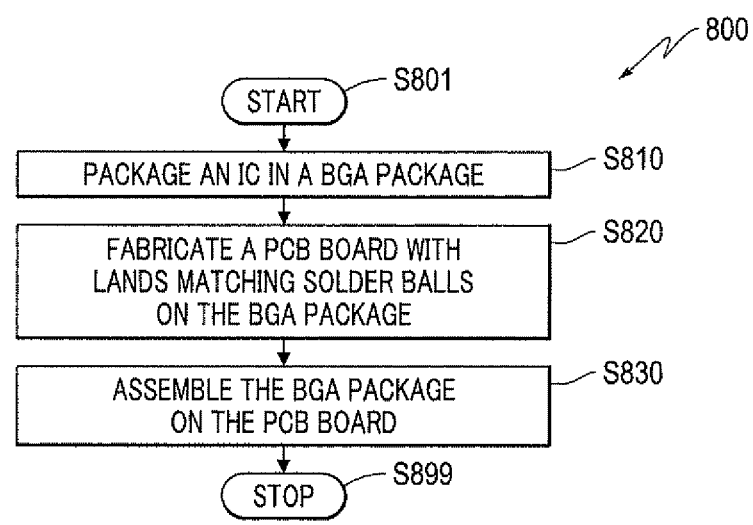
FIG. 8 shows a flow chart outlining a process 800 according to an embodiment of the disclosure.

FIG. 8 shows a flow chart outlining a process 800 according to an embodiment of the disclosure. The process starts at S801 and proceeds to S810.

At S810, an IC chip is packaged in a BGA package at a packaging facility. In an embodiment, the IC chip is a flip chip. The BGA package includes solder balls on a surface. In an embodiment, solder balls for a first pair of differential signals are in symmetry with regard to solder balls for a second pair of differential signals. Further, in an embodiment, solder balls for return paths are positioned symmetrically to the solder balls for differential signals. Solder bumps are formed on I/O pads of the IC chip. A BGA package includes a substrate that also has solder bumps. The solder bumps on the substrate are electrically connected to the solder balls on the surface of the BGA package. The solder bumps on the substrate match the solder bumps of the IC chip. The solder bumps on the IC chip are aligned with the solder bumps on the substrate of the BGA package. Then, the solder bumps are reflowed to form the connection. Thus, the solder balls are connected to the I/O pads by ball modules.

In another embodiment, the I/O pads of the IC chip are wired bonded to form ball modules to electrically connect the I/O pads to the plurality of solder balls on the surface of the BGA package.

At S820, a PCB board is fabricated at a PCB fabrication facility. The PCB board includes multiple layers. On a surface, the PCB board has lands that match the solder balls of the BGA package. For example, the lands have physical dimensions that match the dimension of solder balls. In addition, a land and its matching solder ball are designed to belong to a same transmission path. The lands are electrically connected to vias. The vias are electrically connected to traces on other layers. The traces and further conductive components connect the vias to other circuits, or interfaces to other circuits.

At S830, the BGA package is assembled on the PCB board at an assembly facility. The solder balls of the BGA package are mechanically and electrically fixed to the lands on the PCB board. Other circuit components may also be assembled onto the PCB board. In an example, the PCB board is put in a chassis and connected with other PCB boards to form an electronic system. The process then proceeds to S899 and terminates.

While the subject matter of the present disclosure has been described in conjunction with the specific embodiments thereof that are proposed as examples, it is evident that many alternatives, modifications, and variations will be apparent to those skilled in the art. Accordingly, embodiments of the present disclosure as set forth herein are intended to be illustrative, not limiting. There are changes that may be made without departing from the scope of the present disclosure.

What is claimed is:

1. A ball grid array (BGA) package, comprising:
an integrated circuit (IC) packaged in the BGA package configured to process a first signal, a second signal, a third signal, and a fourth signal, the first signal and the second signal being a first pair of differential signals and the third signal and the fourth signal being a second pair of differential signals;
a first solder ball configured to conduct the first signal disposed on a surface of the BGA package;
a second solder ball configured to conduct the second signal disposed on the surface of the BGA package;
a third solder ball configured to conduct the third signal disposed on the surface of the BGA package;
a fourth solder ball configured to conduct the fourth signal disposed on the surface of the BGA package, wherein the third solder ball has a first equal distance from the first solder ball and the second solder ball, the fourth solder ball has a second equal distance from the first solder ball and the second solder ball, and the first solder ball and the second solder ball are in symmetry with regard to the third solder ball; and
a plurality of grounded solder balls coupled to the IC for ground connections including a first grounded solder ball, a second grounded solder ball, a third grounded solder ball, and a fourth grounded solder ball, wherein the first grounded solder ball is disposed adjacent to the first solder ball, the second grounded solder ball is disposed adjacent to the second solder ball, the third grounded solder ball is disposed adjacent to the third solder ball, the fourth grounded solder ball is disposed adjacent to the third solder ball, the first and the third grounded solder balls are disposed on a line that intersects the first and the third solder balls, and the second and the fourth grounded solder balls are disposed on a line that intersects the second and the third solder balls.

2. The BGA package of claim 1, wherein the IC comprises a serializer/deserializer (SERDES) that is electrically coupled to the first solder ball and the second solder ball configured to transmit the first pair of differential signals or receives the first pair of differential signals.

3. The BGA package of claim 1, wherein the first equal distance is equal to the second equal distance.

4. The BGA package of claim 3, wherein the first equal distance and the second equal distance are smaller than a distance between the first solder ball and the second solder ball.

5. The BGA package of claim 4, wherein the IC comprises:
a first serializer/deserializer (SERDES) that is electrically coupled to the first solder ball and the second solder ball configured to transmit the first pair of differential signals or receives the first pair of differential signals; and
a second serializer/deserializer (SERDES) that is electrically coupled to the third solder ball and the fourth solder ball configured to transmit the second pair of differential signals or receives the second pair of differential signals.

6. The BGA package of claim 1, wherein
the plurality of grounded solder balls are configured to collectively cause an equal electro-magnetic coupling field to the first solder ball and the second solder ball.

7. The BGA package of claim 1, wherein the plurality of grounded solder balls further includes a fifth grounded solder ball, a sixth grounded solder ball, a seventh grounded solder ball, and an eighth grounded solder ball, the fifth grounded solder ball is disposed adjacent to the fourth solder ball, the sixth grounded solder ball is disposed adjacent to the fourth solder ball, the seventh grounded solder ball is disposed adjacent to the second solder ball, the eighth grounded solder ball is disposed adjacent to the first solder ball, the fifth and the seventh grounded solder balls are disposed on a line that intersects the second and the fourth solder balls, and the sixth and the eighth grounded solder balls are disposed on a line that intersects the first and the fourth solder balls.

8. A method, comprising:
forming a first solder ball for transmitting a first signal on a surface of a ball grid array (BGA) package;
forming a second solder ball for transmitting a second signal on the surface of the BGA package;
forming a third solder ball for transmitting a third signal on the surface of the BGA package;
forming a fourth solder ball for transmitting a fourth signal on the surface of the BGA package, wherein the first signal and the second signal are a first pair of differential signals, the third signal and the fourth signal are a second pair of differential signals, the third solder ball has a first equal distance to the first solder ball and the second solder ball, the fourth solder ball has a second equal distance to the first solder ball and the second solder ball, and the first solder ball and the second solder ball are in symmetry with regard to the third solder ball; and
forming a plurality of grounded solder balls on the surface of the BGA package including a first grounded solder ball, a second grounded solder ball, a third grounded solder ball, and a fourth grounded solder ball, wherein the first grounded solder ball is disposed adjacent to the first solder ball, the second grounded solder ball is disposed adjacent to the second solder ball, the third grounded solder ball is disposed adjacent to the third solder ball, the fourth grounded solder ball is disposed adjacent to the third solder ball, the first and the third grounded solder balls are disposed on a line that intersects the first and the third solder balls, and the second and the fourth grounded solder balls are disposed on a line that intersects the second and the third solder balls.

9. The method of claim 8, wherein the first equal distance is equal to the second equal distance.

10. The method of claim 9, wherein the first equal distance and the second equal distance are smaller than a distance between the first solder ball and the second solder ball.

11. A method, comprising:
forming a first conductive unit on a PCB to transmit a first signal, the first conductive unit including a first land that matches a first solder ball on a surface of a ball grid array (BGA) package, and a first via electrically connected to the first land;
forming a second conductive unit on the PCB to transmit a second signal, the second conductive unit including a second land that matches a second solder ball on the surface of BGA package, and a second via electrically connected to the second land;
forming a third conductive unit on the PCB to transmit a third signal, the third conductive unit including a third land that matches a third solder ball on the surface of the BGA package, and a third via electrically connected to the third land;
forming a fourth conductive unit on the PCB to transmit a fourth signal, the fourth conductive unit including a fourth land that matches a fourth solder ball on the surface of the BGA package, and a fourth via electrically connected to the fourth land, wherein the first signal and the second signal are a pair of differential signals, the third signal and the fourth signal being a second pair of differential signals, the third via has a first equal distance to the first via and the second via, the fourth via has a second equal distance to the first via and the second via, thus the first via and the second via are in symmetry with regard to the third via; and
forming a plurality of grounded conductive units including a first grounded conductive unit including a first grounded land that matches a first grounded solder ball on the surface of the BGA package and a first grounded via electrically connected to the first grounded land, a second grounded conductive unit including a second grounded land that matches a second grounded solder ball on the surface of the BGA package and a second grounded via electrically connected to the second grounded land, a third grounded conductive unit including a third grounded land that matches a third grounded solder ball on the surface of the BGA package and a third grounded via electrically connected to the third grounded land, and a fourth grounded conductive unit including a fourth grounded land that matches a fourth grounded solder ball on the surface of the BGA package and a fourth grounded via electrically connected to the fourth grounded land, wherein the first grounded via is disposed adjacent to the first via, the second grounded via is disposed adjacent to the second via, the third grounded via is disposed adjacent to the third via, the fourth grounded via is disposed adjacent to the third via, the first and the third grounded vias are disposed on a line that intersects the first and the third vias, and the second and the fourth grounded vias are disposed on a line that intersects the second and the third vias.

12. The method of claim 11, wherein the first via and the second via in are symmetry with regard to the third via and the fourth via, and the third via and the fourth via are in symmetry with regard to the first via and the second via.

13. The method of claim 11, further comprising:
assembling the BGA package on the PCB.

14. A printed circuit board (PCB), comprising:
- a first conductive unit configured to make electrical connection with a first solder ball of a ball grid array (BGA) package to conduct a first signal, the first conductive unit including a first land and a first via on the PCB;
- a second conductive unit configured to make electrical connection with a second solder ball of the BGA package to conduct a second signal, the second conductive unit including a second land and a second via on the PCB, the first signal and the second signal being a first pair of differential signals;
- a third conductive unit configured to make electrical connection with a third solder ball of the BGA package to conduct a third signal, the third conductive unit including a third land and a third via on the PCB;
- a fourth conductive unit configured to make electrical connection with a fourth solder ball of the BGA package to conduct a fourth signal, the fourth conductive unit including a fourth land and a fourth via on the PCB, the third signal and the fourth signal being a second pair of differential signals, wherein the third via has a first equal distance from the first via and the second via, the fourth via has a second equal distance to the first via and the second via, thus the first via and the second via are in symmetry with regard to the third via; and
- a plurality of grounded conductive units including a first grounded conductive unit configured to make electrical connection with a first grounded solder ball of the BGA package and including a first grounded land and a first grounded via on the PCB, a second grounded conductive unit configured to make electrical connection with a second grounded solder ball of the BGA package and including a second grounded land and a second grounded via on the PCB, a third grounded conductive unit configured to make electrical connection with a third grounded solder ball of the BGA package and including a third grounded land and a third grounded via on the PCB, and a fourth grounded conductive unit configured to make electrical connection with a fourth grounded solder ball of the BGA package and including a fourth grounded land and a fourth grounded via on the PCB, wherein the first grounded via is disposed adjacent to the first via, the second grounded via is disposed adjacent to the second via, the third grounded via is disposed adjacent to the third via, the fourth grounded via is disposed adjacent to the third via, the first and the third grounded vias are disposed on a line that intersects the first and the third vias, and the second and the fourth grounded vias are disposed on a line that intersects the second and the third vias.

15. The PCB of claim 14, wherein the second equal distance is the same as the first equal distance.

16. The PCB of claim 15, wherein the first equal distance is less than a distance between the first via and the second via.

17. The PCB of claim 14, wherein the first via, the second via, the third via and the fourth via respectively shift from the first land, the second land, the third land and the fourth land in a same shift direction and by a same shift distance.

18. The PCB of claim 14, further comprising:
- the BGA package assembled on the PCB.

19. The PCB of claim 14, wherein the first grounded via, the second grounded via, the third grounded via, and the fourth grounded via are configured to collectively cause an equal electro-magnetic coupling field to the first via and the second via.

* * * * *